(12) United States Patent
Sakai et al.

(10) Patent No.: US 7,844,857 B2
(45) Date of Patent: Nov. 30, 2010

(54) WRITING DATA PROCESSING CONTROL APPARATUS, WRITING METHOD, AND WRITING APPARATUS

(75) Inventors: Yusuke Sakai, Kanagawa (JP); Tomoyuki Horiuchi, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 514 days.

(21) Appl. No.: 11/858,381

(22) Filed: Sep. 20, 2007

(65) Prior Publication Data
US 2008/0235535 A1 Sep. 25, 2008

(30) Foreign Application Priority Data
Sep. 21, 2006 (JP) .............................. 2006-255282

(51) Int. Cl.
*G06F 11/00* (2006.01)
*G01R 31/28* (2006.01)

(52) U.S. Cl. .............................. 714/30; 714/10; 714/11; 714/13; 714/25; 714/46; 714/715; 347/225; 358/1.14; 358/1.15; 430/5; 438/4; 438/5; 438/6; 438/7; 438/8; 438/9; 438/10; 438/11; 438/12; 438/13; 438/14; 438/15; 438/16; 438/17; 438/18

(58) Field of Classification Search ................. 347/225; 358/1.14, 1.15, 1.1, 448; 714/10, 11, 13; 438/4–18; 430/5
See application file for complete search history.

(56) References Cited

U.S. PATENT DOCUMENTS

| | | | | |
|---|---|---|---|---|
| 4,845,483 A | * | 7/1989 | Negishi ....................... | 340/557 |
| 5,255,010 A | * | 10/1993 | Mackin ....................... | 347/237 |
| 5,363,497 A | * | 11/1994 | Baker et al. .................. | 711/153 |
| 5,493,634 A | * | 2/1996 | Bonk et al. .................. | 358/1.1 |
| 5,625,757 A | * | 4/1997 | Kageyama et al. .......... | 358/1.14 |
| 6,060,716 A | * | 5/2000 | Kawase .................... | 250/492.22 |
| 6,124,974 A | * | 9/2000 | Burger ........................ | 359/621 |
| 6,132,910 A | * | 10/2000 | Kojima ........................ | 430/22 |
| 6,263,452 B1 | * | 7/2001 | Jewett et al. ................... | 714/9 |

(Continued)

FOREIGN PATENT DOCUMENTS

JP 6-97058 4/1994

OTHER PUBLICATIONS

Deloose, "Large Scale Parrallel Print Service", 2000, CERN, pp. 1-6.*

*Primary Examiner*—Robert Beausoliel
*Assistant Examiner*—Jeison C Arcos
(74) *Attorney, Agent, or Firm*—Oblon, Spivak, McClelland, Maier & Neustadt, L.L.P.

(57) ABSTRACT

A writing data processing control apparatus includes an assignment part configured to assign processing of a plurality of pieces of writing data of predetermined divided writing regions, stored in a storage device, one by one to one of a plurality of processing apparatuses in which processing is performed in parallel, and a separation part configured, when a processing error occurred as a result of processing of writing data read from the storage device by a first processing apparatus assigned, to separate the first processing apparatus in which the processing error occurred from assigning targets of subsequent writing data processing, wherein the assignment part reassigns the processing of the writing data in which the processing error occurred to a second processing apparatus being different from the first processing apparatus.

9 Claims, 5 Drawing Sheets

U.S. PATENT DOCUMENTS

| | | | |
|---|---|---|---|
| 6,381,072 B1* | 4/2002 | Burger | 359/622 |
| 6,455,863 B1* | 9/2002 | Babin et al. | 250/492.23 |
| 6,552,340 B1* | 4/2003 | Krivanek et al. | 850/7 |
| 6,603,128 B2* | 8/2003 | Maehara et al. | 250/441.11 |
| 6,735,641 B1* | 5/2004 | Kobayashi et al. | 710/15 |
| 7,205,541 B1* | 4/2007 | Mito et al. | 250/310 |
| 7,598,504 B2* | 10/2009 | Kimura et al. | 250/492.2 |
| 2002/0009901 A1* | 1/2002 | Maehara et al. | 438/795 |
| 2002/0063891 A1* | 5/2002 | Ueda et al. | 358/1.15 |
| 2002/0088940 A1* | 7/2002 | Watanabe et al. | 250/310 |
| 2002/0116697 A1* | 8/2002 | Okamoto et al. | 716/21 |
| 2002/0186407 A1* | 12/2002 | Laughlin | 358/1.15 |
| 2002/0198606 A1* | 12/2002 | Satou | 700/2 |
| 2005/0157349 A1* | 7/2005 | Pangrazio et al. | 358/442 |
| 2006/0175548 A1* | 8/2006 | Kawasaki et al. | 250/310 |
| 2007/0187601 A1* | 8/2007 | Mito et al. | 250/310 |
| 2008/0221816 A1* | 9/2008 | Anpo et al. | 702/82 |
| 2009/0285494 A1* | 11/2009 | Handa et al. | 382/218 |

* cited by examiner

Related Art

US 7,844,857 B2

WRITING DATA PROCESSING CONTROL APPARATUS, WRITING METHOD, AND WRITING APPARATUS

CROSS-REFERENCE TO RELATED APPLICATION

This application is based upon and claims the benefit of priority from the prior Japanese Patent Application No. 2006-255282 filed on Sep. 21, 2006 in Japan, the entire contents of which are incorporated herein by reference.

BACKGROUND OF THE INVENTION

1. Field of the Invention

The present invention relates to a writing data processing control apparatus, a writing method, and a writing apparatus. More particularly, for example, the present invention relates to an electron beam writing method by which a target workpiece is irradiated with a variable-shaped electron beam, an electron beam pattern writing apparatus using the method, and a data processing apparatus configuring the electron beam writing apparatus.

2. Description of the Related Art

Microlithography technology which forwards miniaturization of semiconductor devices is extremely important, because only this process performs forming a pattern in semiconductor manufacturing processes. In recent years, with an increase in high integration and large capacity of large-scale integrated circuits (LSI), a circuit line width required for semiconductor elements is becoming narrower and narrower. In order to form a desired circuit pattern on these semiconductor devices, a master pattern (also called a mask or a reticle) with high precision is required. Then, since the electron beam technology for writing or "drawing" a pattern has excellent resolution intrinsically, it is used for manufacturing such high precision master patterns.

FIG. 5 shows a schematic diagram describing operations of a conventional variable-shaped electron beam writing apparatus. The variable-shaped electron beam (EB) pattern writing apparatus operates as follows: As shown in the figure, the pattern writing apparatus includes two aperture plates. A first or "upper" aperture plate 410 has an opening or "hole" 411 in the shape of a rectangle for shaping an electron beam 330. This shape of the rectangular opening may also be a square, a rhombus, a rhomboid, etc. A second or "lower" aperture plate 420 has a variable-shaped opening 421 for shaping the electron beam 330 having passed through the opening 411 of the first aperture plate 410 into a desired rectangle. The electron beam 330 that left a charged particle source 430 and has passed through the opening 411 is deflected by a deflector. Then, the electron beam 330 passes through a part of the variable-shaped opening 421 of the second aperture plate 420, and irradiates a target workpiece 340 mounted on a stage that is continuously moving in a predetermined direction (e.g. X-axis direction). In other words, a rectangular shape capable of passing through both of the opening 411 and the variable-shaped opening 421 is written in a pattern writing region of the target workpiece 340 mounted on the stage. This method of writing or "forming" a given variable shape by letting beams pass through both of the opening 411 and the variable-shaped opening 421 is called a variable shaped beam (VSB) system.

In the electron beam pattern writing apparatus, during from inputting writing data up to actually shooting a pattern defined by the writing data onto a target workpiece, the data is converted into internal format data according to the specification of the pattern writing apparatus. During this time, parallel processing is performed using a plurality of processing apparatuses in order to reduce the processing time.

Although it is not the processing in the electron beam pattern writing apparatus, a method of generating writing data for the electron beam writing apparatus is disclosed that each processing target region is assigned to a plurality of CPUs at the stage of generating writing data to be input for electron beam writing to perform parallel processing independently (refer to, e.g., Japanese Unexamined Patent Publication No. 6-97058 (JP-A-6-97058)).

As mentioned above, in the electron beam pattern writing apparatus, writing data inputted is converted to internal format data of the pattern writing apparatus by using a plurality of processing devices in which processing is performed in parallel according to the specification of the pattern writing apparatus. If a conversion error occurs in a processing apparatus, to which a certain processing is assigned, in a plurality of processing apparatuses, it becomes impossible to write a desired pattern defined by the writing data. Then, if a user newly performs the conversion processing of the writing data inputted from the first after separating the processing apparatus having the error from the system, it is a loss of time and the writing time will become long.

BRIEF SUMMARY OF THE INVENTION

It is an object of the present invention to provide a writing data processing control apparatus, a writing method, and a pattern writing apparatus that can efficiently perform processing of writing data even when a processing error occurs in a part of processing apparatuses which perform parallel processing.

In accordance with one aspect of the present invention, a writing data processing control apparatus includes an assignment part configured to assign processing of a plurality of pieces of writing data of predetermined divided writing regions, stored in a storage device, one by one to one of a plurality of processing apparatuses in which processing is performed in parallel, and a separation part configured, when a processing error occurred as a result of processing of writing data read from the storage device by a first processing apparatus assigned, to separate the first processing apparatus in which the processing error occurred from assigning targets of subsequent writing data processing, wherein the assignment part reassigns the processing of the writing data in which the processing error occurred to a second processing apparatus being different from the first processing apparatus.

In accordance with another aspect of the present invention, a writing apparatus for writing a pattern by using a lithography technique includes a storage part configured to store a plurality of pieces of writing data of predetermined divided writing regions, a plurality of data processing parts configured to perform processing of the plurality of pieces of writing data stored in the storage part in parallel, a writing data processing control part configured to assign processing of writing data in the plurality of pieces of writing data to one of the plurality of data processing parts, and reassign, when a processing error occurred in the processing of the writing data in the one of the plurality of data processing parts, the processing of the writing data to another data processing part, and a writing part configured, based on writing data processed by one of the plurality of data processing parts, to write a pattern defined by the writing data onto a target workpiece by using a charged particle beam.

In accordance with another aspect of the present invention, a method for writing a pattern by using a lithography technique includes assigning processing of a plurality of pieces of writing data of predetermined divided writing regions, stored in a storage device, one by one to one of a plurality of processing apparatuses in which processing is performed in parallel, separating, when a processing error occurred as a result of processing writing data read from the storage device by a first processing apparatus assigned, to separate the first processing apparatus in which the processing error occurred from assigning targets of subsequent writing data processing, reassigning the processing of the writing data in which the processing error occurred to a second processing apparatus being different from the first processing apparatus, and writing a pattern defined by the writing data onto a target workpiece by using a charged particle beam, based on the writing data processed by the second processing apparatus.

BRIEF DESCRIPTION OF THE WRITINGS

DETAILED DESCRIPTION OF THE INVENTION

Embodiment 1

In the following Embodiment, there will be described a structure using an electron beam as an example of a charged particle beam. The charged particle beam is not restricted to the electron beam, and may be a beam using other charged particle, such as an ion beam.

Figure 1:
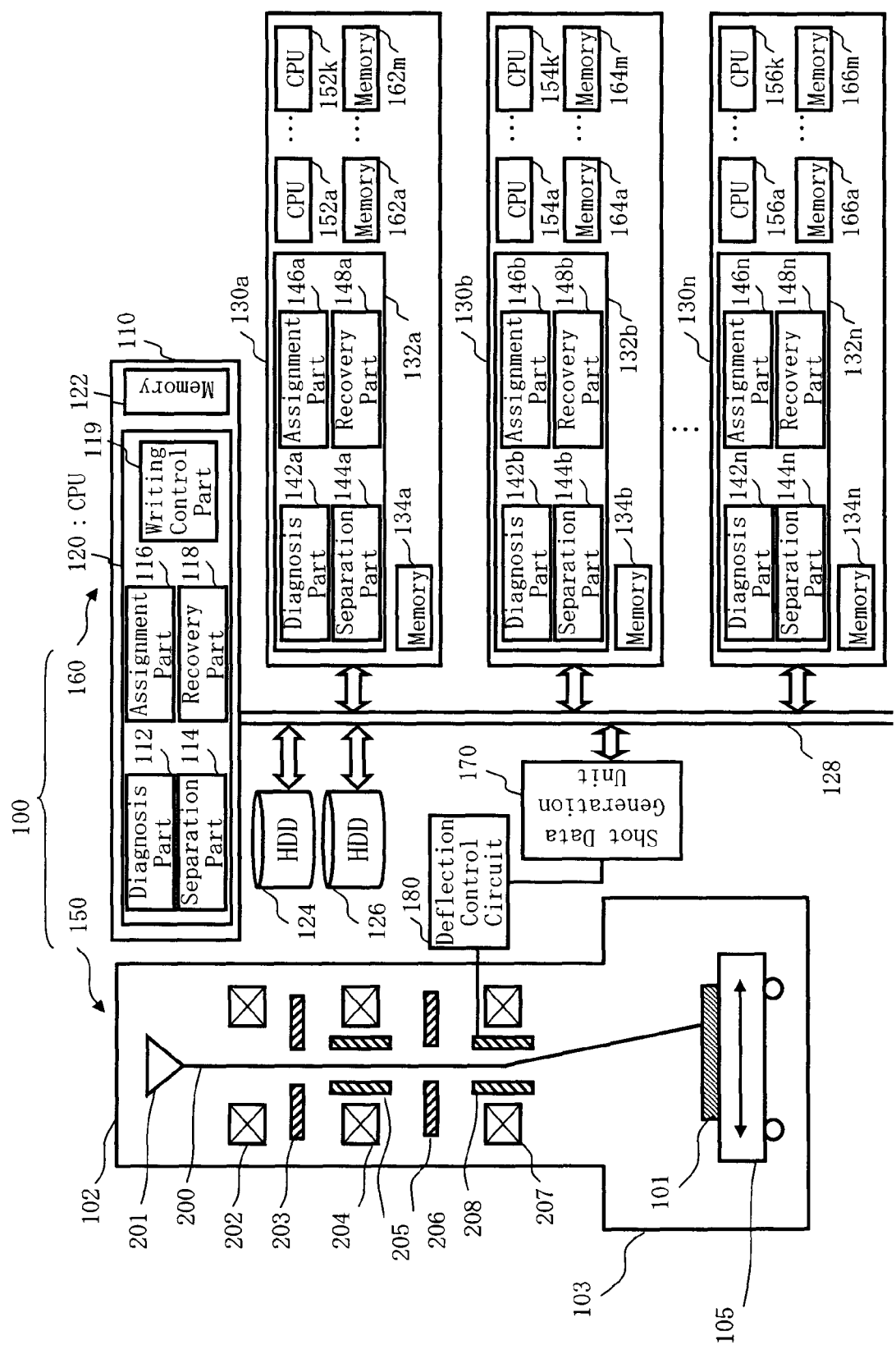
FIG. 1 is a schematic diagram showing a configuration of a pattern writing apparatus described in Embodiment 1.

FIG. 1 is a schematic diagram showing a configuration of a pattern writing apparatus described in Embodiment 1. In the figure, a pattern writing apparatus 100 serving as an example of a charged particle beam pattern writing apparatus or a charged particle beam lithography apparatus. The pattern writing apparatus 100 includes a pattern writing part 150 and a control part 160. The pattern writing apparatus 100 writes or "draws" a pattern onto a target workpiece 101 by using a lithography technique. An example of this workpiece 101 is a photo-mask for use in the manufacture of ULSI semiconductor circuit devices. The pattern writing part 150 includes an electron lens barrel 102 and a writing chamber 103. In the electron lens barrel 102, an electron gun assembly 201, an illumination lens 202, a first aperture plate 203, a projection lens 204, a deflector 205, a second aperture plate 206, an objective lens 207, and a deflector 208 are arranged. In the writing chamber 103, an XY stage 105 is arranged. On the XY stage 105, the target workpiece 101 to be written is laid or "placed".

The control part 160 includes a writing control unit 110, a plurality of parallel processing units 130, a hard disk drive (HDD) 124, a magnetic disk drive (HDD) 126 serving as a high speed storage unit, a shot data generation unit 170, and a deflection control circuit 180. The writing control unit 110 is connected to the a plurality of parallel processing units 130, the hard disk drive (HDD) 124, the magnetic disk drive (HDD) 126, and the shot data generation unit 170 through a bus 128. In the HDD 124 serving as an example of a storage part, there is stored a writing data group that was converted and generated in an external apparatus from design data (layout data) to be in accordance with an internal format of the pattern writing apparatus 100. The writing data group is defined by a plurality of pieces of writing data of predetermined writing regions made by virtually dividing the writing region of the target workpiece 101. In each writing data, a figure pattern to be written is defined.

The writing control unit 110, serving as an example of a writing data processing control part or a writing data processing control apparatus, includes a CPU 120 and a memory 122. The CPU 120 serving as a computer has functions, such as a diagnosis part 112, a separation part 114, an assignment part 116, a recovery part 118, and a writing control part 119. Input data or output data processed in the CPU 120 is stored in the memory 122. In the present case, each of the functions, such as the diagnosis part 112, the separation part 114, the assignment part 116, the recovery part 118, and the writing control part 119, is configured as software whose processing is executed by a computer (CPU 120). However, it should not be limited thereto. For example, they may be configured by hardware of an electric circuit. Alternatively, they may be executed by a combination of hardware of an electric circuit and software, or a combination of hardware and firmware.

Each parallel processing unit 130, such as a parallel processing unit 130a, a parallel processing unit 130b, . . . and a parallel processing unit 130n, serving as an example of a parallel processing part or a processing apparatus, includes a CPU 132, a memory 134, a plurality of CPUs that actually perform data conversion processing, and a plurality of memories. In FIG. 1, the parallel processing unit 130a includes a CPU 132a, a memory 134a, CPUs 152a to 152k (an example of an internal processing apparatus), and a plurality of memories 162a to 162m. The parallel processing unit 130b includes a CPU 132b, a memory 134b, CPUs 154a to 154k (an example of an internal processing apparatus), and a plurality of memories 164a to 164m. The parallel processing unit 130n includes a CPU 132n, a memory 134n, CPUs 156a to 156k (an example of an internal processing apparatus), and a plurality of memories 166a to 166m. Each CPU 132 serving as a computer includes functions, such as a diagnosis part 142, a separation part 144, an assignment part 146, and a recovery part 148. Input data or output data processed in each CPU 132 is stored in each memory 134 in each parallel processing unit 130. Each of the functions, such as the diagnosis part 142, the separation part 144, the assignment part 146, and the recovery part 148, is configured as software whose processing is executed by a computer (CPU 132). However, it should not be limited thereto. For example, they may be configured by hardware of an electric circuit. Alternatively, they may be executed by a combination of hardware of an electric circuit and software, or a combination of hardware and firmware. While only the structure elements necessary for describing Embodiment 1 are shown in FIG. 1, it should be understood that other structure elements generally necessary for the pattern writing apparatus 100 may also be included.

Figure 2:
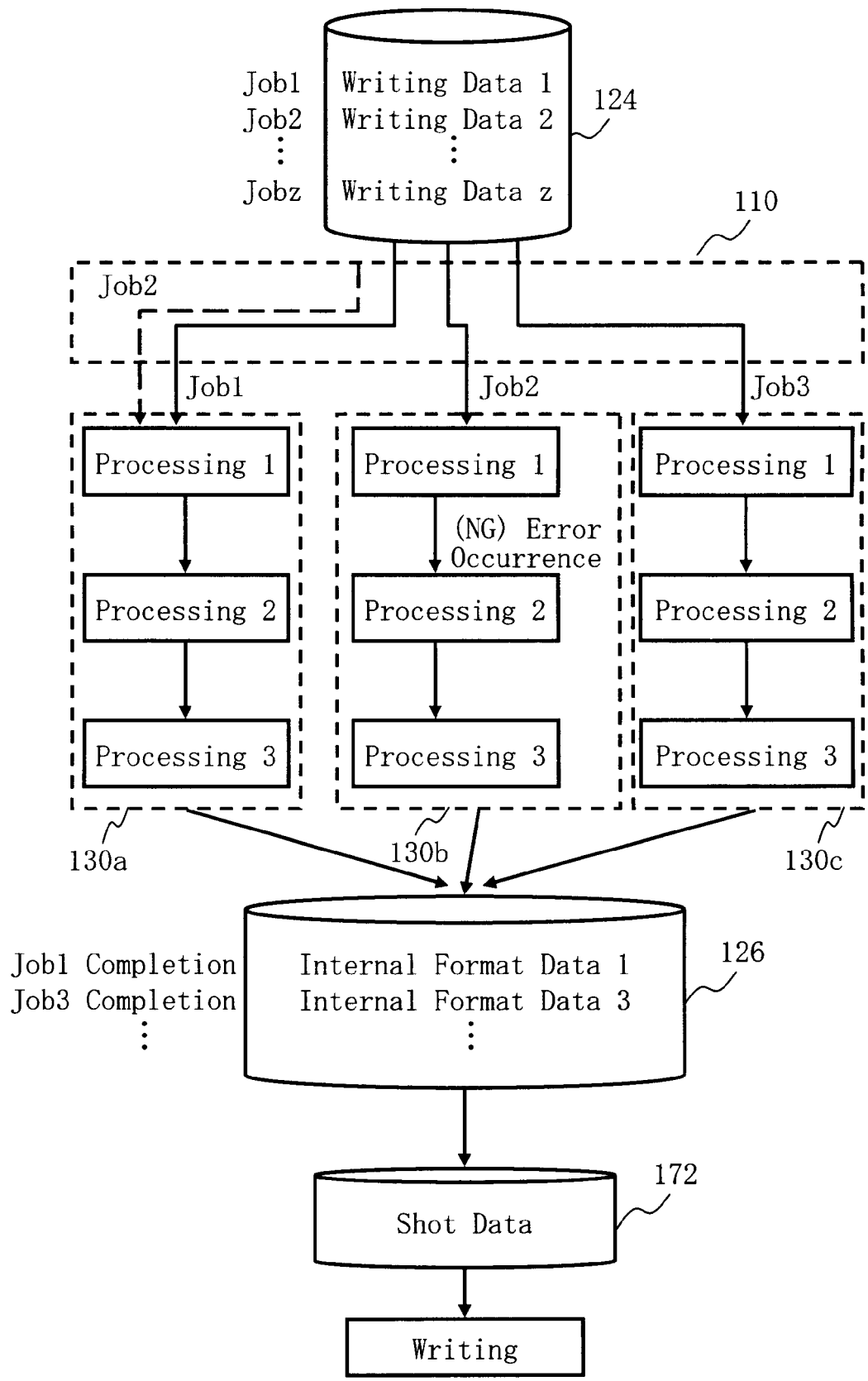
FIG. 2 shows a flow of conversion processing of writing data described in Embodiment 1.

FIG. 2 shows a flow of conversion processing of writing data described in Embodiment 1. In the control part 160 of the pattern writing apparatus 100, each writing data in the writing data group (writing data 1, writing data 2, . . . , writing data Z) stored in the HDD 124 is respectively converted into internal format data of the apparatus, through data conversions of processing 1, processing 2, processing 3, and so on. FIG. 2 shows the cases of processing 1, processing 2, and processing 3 as an example. The data conversion command for the writing data 1 is denoted as Job1, the command for the writing data 2 is denoted as Job2, and the command for the writing data Z is denoted as JobZ. In the converted internal format data, "Job1 completion" indicates that the processing of Job1 has been completed and internal format data 1 has been generated, and "Job3 completion" indicates that the processing of Job3 has been completed and internal format data 3 has been generated. Then, the group of the converted internal format data is temporarily stored in the HDD 126 serving as a buffer. The internal format data group is read from the HDD 126 being a high speed memory to the shot data generation unit 170 in real time when, for example, data for a writing unit, e.g., a frame made by virtually dividing a writing region of the target workpiece 101 into strip-like areas in the y direction has been prepared. Then, the internal format data which has been read is deleted in order in the HDD 126. Thus, it becomes possible to store new internal format data at any time while suppressing the size of the memory. The read internal format data is converted into shot data by the shot data generation unit 170, and is stored in a memory 172 in the shot data generation unit 170. The deflection control circuit 180 outputs a signal to a deflector through a digital analog converter (DAC) amplifier (not shown) based on the shot data, to write a pattern defined by the shot data onto a desired position of the writing region of the target workpiece 101 by deflecting the electron beam 200. Converting from the writing data into the internal format data of the apparatus and further into the shot data, and writing processing after the converting are performed continuously. That is, while performing writing, conversion of the subsequent writing data is processed in real time.

The data conversion of the writing data group stored in the HDD 124 is performed in parallel in a plurality of parallel processing units 130a to 130n. The writing control unit 110 controls and manages which processing of the Jobs is assigned to which of the parallel processing units. The assignment part 116 assigns processing of each writing data in the writing data group to one of a plurality of parallel processing units 130a to 130n one by one. Moreover, each of the processing 1, the processing 2, the processing 3, and the like mentioned above is performed by one of a plurality of CPUs in each parallel processing unit. For example, such processing is executed by one of the CPUs 152a to 152k in the parallel processing unit 130a. The process program, cache data, and queue data for executing are stored in one of the memories 162a to 162m. Similarly, such processing is executed by one of the CPU 154a to 154k in the parallel processing unit 130b. The process program, cache data, and queue data for executing are stored in one of the memories 164a to 164m. Similarly, such processing is executed by one of the CPU 156a to 156k in the parallel processing unit 130n. The process program, cache data, and queue data for executing are stored in one of the memories 166a to 166m.

FIG. 2 shows the case, as an example, where the assignment part 116 assigns Job1 to the parallel processing unit 130a, Job2 to the parallel processing unit 130b, and Job3 to the parallel processing unit 130c. In the parallel processing unit 130a, the conversion processing for the writing data 1 is performed according to the Job1 in order of the steps: the first data conversion step (processing 1), the second data conversion step (processing 2), and the third data conversion step (processing 3). When the Job1 has been completed, the data is stored in the HDD 126 as internal format data 1. Similarly, in the parallel processing unit 130c, the conversion processing for the writing data 3 is performed according to the Job3 in order of the steps: the first data conversion step (processing 1), the second data conversion step (processing 2), and the third data conversion step (processing 3). When the Job3 has been completed, the data is stored in the HDD 126 as internal format data 3. On the other hand, in the parallel processing unit 130b in FIG. 2, when the conversion processing of the first data conversion step (processing 1) and the second data conversion step (processing 2) for the writing data 2 has been finished according to the Job2, a processing error occurs in the processing 2 processed by the CPU 154k. Accordingly, since the internal format data 2 to which the writing data 2 is to be converted is not generated, shot data corresponding to this portion is also not generated, thereby becoming impossible to perform the writing.

Figure 3:
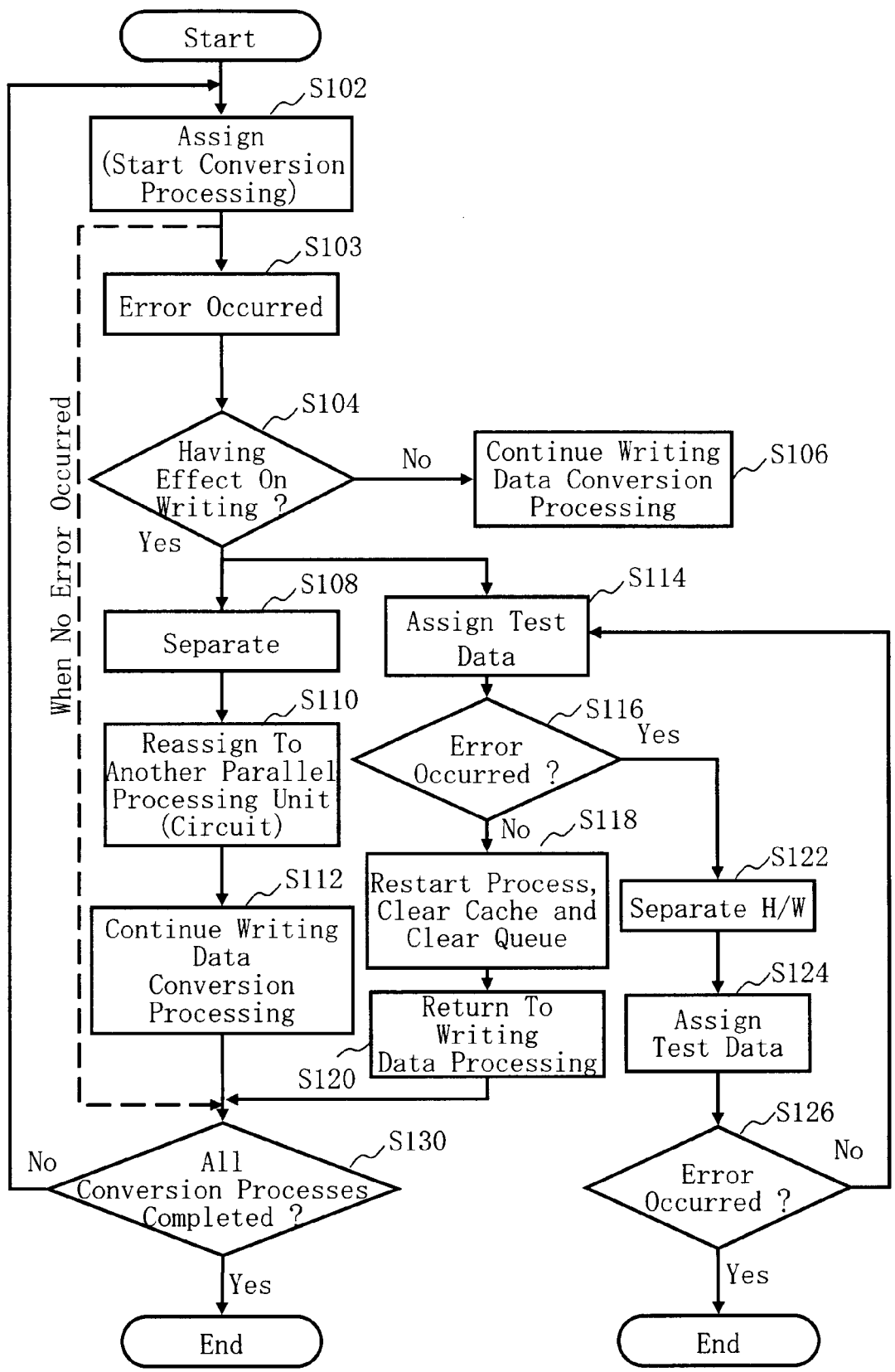
FIG. 3 is a flowchart showing a main part of each step of conversion processing of writing data according to a writing method described in Embodiment 1.

Then, according to Embodiment 1, it is configured that the processing advances as stated below when an error occurs in the data conversion processing. FIG. 3 is a flowchart showing a main part of each step of the conversion processing of the writing data according to the writing method described in Embodiment 1.

In S102, as an assigning step (the first assigning step), the assignment part 116 serially assigns processing (Job) of a plurality of pieces of writing data of predetermined divided writing regions, stored in the HDD 124 serving as a storage device to one of a plurality of parallel processing units 130a to 130n being examples of a plurality of processing apparatuses in which processing is performing in parallel. Each parallel processing unit 130 reads the assigned writing data from the HDD 124 through the bus 128, and advances data conversion processing one by one as shown in FIG. 2. Moreover, each parallel processing unit 130 performs the parallel processing independently each other.

In S103, as an error occurrence detecting step, when a processing error occurs as a result of executing the processing of the assigned writing data by the assigned parallel processing unit 130, the writing control part 119 detects the error occurrence. As the detecting method, for example, an error can be detected by receiving a signal being error data transmitted from the assigned parallel processing unit 130. Alternatively, when the assignment part 116 transmits an assignment direction signal for assigning a Job to an assigned parallel processing unit 130, if no reply signal (Ack signal) is transmitted after a predetermined time having passed, it can be regarded as an error occurrence to be detected.

In S104, as a judging step, the writing control part 119 judges whether the error occurred has an effect on the writing or not. Then, when it is judged to have no effect on the writing, it goes to S106 to continue the writing data conversion processing. If judged to have an effect on the writing, it goes to S108 and S114.

In S108, as a separating step, the separation part 114 separates the parallel processing unit 130, in which the processing error occurred (e.g., the parallel processing unit 130b (an example of the first processing apparatus) in which an error occurred during performing the Job2 in FIG. 2), from the assigning targets of the subsequent writing data processing. By separating, an error to occur in the subsequent writing data processing can be prevented. The separation is executed not by cutting the circuit itself being hardware by a user etc. but by excluding the parallel processing unit 130 in which the processing error occurred from the Job assigning targets.

In S110, as an assigning step (the second assigning step), the assignment part 116 reassigns the processing of the writing data where the processing error occurred (the Job2 in FIG. 2) to another parallel processing unit 130 (the parallel processing unit 130a in FIG. 2) (the second processing apparatus) being different from the parallel processing unit 130 in which the processing error occurred (parallel processing unit 130b in FIG. 2). Then, the reassigned parallel processing unit 130, for example, the parallel processing unit 130a in FIG. 2 reads the reassigned writing data 2 subsequent to the writing data previously assigned (Job1 in FIG. 2) from the HDD 124 through the bus 128, and advances the data conversion processing as shown in FIG. 2. At this time, since the parallel processing unit 130 in which the error occurred has already been separated, the writing data conversion processing can be continued in S112.

The configuration stated above makes it possible to reperform the processing by a substitute unit even when a processing error occurs in one of a plurality of parallel processing units 130. Therefore, redundancy can be given to the processing of writing data. As a result, writing data can be processed efficiently without delaying the conversion processing.

On the other hand, with respect to the parallel processing unit 130b in which the error occurred, diagnosing and recovering are tried as stated below.

In S114, as a test data assigning step being a part a diagnosing step, the diagnosis part 112 assigns the processing of test data stored in the memory 122 to the separated parallel processing unit 130b, and outputs the test data to the separated parallel processing unit 130b. Then, the parallel processing unit 130b performs the processing of the input test data.

In S116, as a judging step being a part of a diagnosing step, the diagnosis part 112 diagnoses whether a malfunction occurs in processing the test data in the parallel processing unit 130b or not. An example of the malfunction is a processing error. The method of judging whether a malfunction occurs or not, i.e., the method of detecting an error may be the same as that of the detecting error occurrence (S103) mentioned above. Then, if a malfunction has not occurred in the processing of the test data, it goes to S118 regarding the error as a temporary failure, such as a timing error of signal transmission/reception. When a malfunction occurred in the processing of the test data, it goes to S122.

In S118, as a reset step, a recovery part 148b of the separated parallel processing unit 130b restarts the processing program of each CPU 154a to 154k in the parallel processing unit 130b. Then, the cache data and the queue data stored in the memories 164a to 164m are cleared.

In S120, as a recovery step, when a malfunction has not occurred in the processing of the test data, the recovery part 118 recovers the separated parallel processing unit 130b to be added to the assigning targets of the subsequent writing data processing. Thus, it is possible to automatically diagnose and recover the separated parallel processing unit 130b without troubling the user while the parallel processing is being performed by other parallel processing units 130.

That is, the parallel processing unit 130 in which an error occurred can be diagnosed in real time while the processing of the writing data process is being performed by other parallel processors. Then, if it can be recovered, the unit having an error can be returned to perform processing of the writing data again after being recovered. Therefore, the robustness of the processing of writing data is further increased.

In S122, as a separating step, when a malfunction occurred in processing the test data, if the cause of the malfunction exists in the CPU side or the cause of the malfunction is unknown, a separation part 144b of the separated parallel processing unit 130b separates the CPU (for example, the CPU 154k) that executed the processing of the test data. When the cause of the malfunction exists in the memory side, the memory (for example, the memory 164m) used for the processing of the test data in the memories 164a to 164m is separated.

In S124, as a test data assigning step, the diagnosis part 112 reassigns the processing of the test data stored in the memory 122 to the separated parallel processing unit 130b, and outputs the test data to the separated parallel processing unit 130b. In the separated parallel processing unit 130b, an assignment part 146b makes an internal processing apparatus (for example, the CPU 154a) that is different from the internal processing apparatus (for example, the CPU 154k) having processed the test data execute the processing of the test data again.

In S126, as a diagnosing step, the diagnosis part 112 diagnoses again whether a malfunction occurs in the second-time processing of the test data or not. Specifically, a diagnosis part 142b in the separated parallel processing unit 130b diagnoses whether a malfunction occurs in the second time processing of the test data. As the diagnosing method, for example, an error can be detected by receiving a signal being error data transmitted from the assigned CPU 154a. Alternatively, if no reply signal (Ack signal) is transmitted from the CPU 154a after a predetermined time having passed, it can be regarded as an error occurrence to be detected. Further alternatively, when the processing has not been completed even after a predetermined time has passed, it is also suitable for the CPU 154a to regard this state as an error occurrence to be detected. Then, the error detection result is transmitted to the diagnosis part 112 at the upper flow side. If a malfunction occurs even in this processing of the test data, it is regarded that the software itself malfunctions, thereby ending the writing processing. Moreover, when a malfunction has not occurred in processing the test data, it is regarded as a malfunction of hardware, such as the separated CPU, and then it returns to S114 while the separated CPU is still separated. Thus, by performing separation, reassignment, diagnose and recovery in the parallel processing unit 130, it becomes possible to automatically diagnose and recover the separated parallel processing unit without troubling the user.

In S116, when detecting an error occurrence is based on that a reply signal (Ack signal) has not been transmitted from the parallel processing unit 130b, there is a case of communication with the parallel processing unit 130b itself being unexecutable. In such a case, it may also be suitable to end the writing processing because it is impossible to execute the processing of S118 to S126 required to be performed in the parallel processing unit 130b.

In S130, as a judging step, the writing control part 119 judges whether all the conversion processes have been completed or not. Then, when not completed yet, it returns to S102, and when completed, the data conversion step is ended.

As a writing step, the writing unit 150 writes a pattern defined by writing data onto the target workpiece 101 by using an electron beam 200, based on the writing data processed in the reassigned parallel processing unit 130 (for example, the parallel processing unit 130a for the Job2 in FIG. 2). As mentioned above, the converted writing data is temporarily stored in the HDD 126 as internal format data of the apparatus, and then converted into shot data and output to the deflection control circuit 180. A desired pattern is written as follows:

The electron beam 200, leaving the electron gun assembly 201, is irradiated or "shot" by the illumination lens 202 onto the whole of the first aperture plate 203 having a rectangular opening, for example. At this point, the electron beam 200 is shaped to be a desired rectangle, for example. Then, after having passed through the first aperture plate 203, the electron beam 200 of a first aperture image is guided by the projection lens 204 to reach the second aperture plate 206. The position of the first aperture image on the second aperture plate 206 is deflected/controlled by the deflector 205 which is controlled by the deflection control circuit 180, and thereby the shape and size of the beam can be changed. After having passed through the second aperture plate 206, the electron beam 200 of a second aperture image is focus-adjusted by the objective lens 207 and deflected by the deflector 208 which is controlled by the deflection control circuit 180, to reach a desired position on the target workpiece 101 placed on the XY stage 105 movably arranged. In this way, a desired pattern is written.

The inside of the electron lens barrel 102 and the writing chamber 103 is exhausted by a vacuum pump (not shown), and controlled to be a pressure lower than atmospheric pressure. The atmosphere temperature in the writing chamber 103 is measured by a temperature sensor 242, and the pressure in it is measured by a pressure sensor 244.

According to the present Embodiment, as mentioned above, since the redundancy can be given to the processing of writing data, the writing data can be efficiently processed without delaying the conversion processing. Therefore, increase of the writing time caused by the error in a processing apparatus (unit) can be controlled.

Processing contents or operation contents of what is represented by the word "part", "unit", or "step" in the above description can be configured by a computer-executable program. It may be executed by a software program, or alternatively by any combination of software, hardware and/or firmware. When configured by a program, the program is recordable or storable onto a recording medium (not shown), such as a magnetic disk drive, a magnetic tape drive, FD, and ROM (read-only memory). For example, it is recorded on the memory 122.

Moreover, each CPU serving as a computer in FIG. 1 may be connected, via a bus (not shown), to a RAM (Random Access Memory), a ROM, and a magnetic disk (HD) drive serving as examples of a storage device, a keyboard (K/B) and a mouse serving as examples of an input means, a monitor and a printer serving as examples of an output means, or an external interface (I/F), FD, DVD, CD, etc. serving as examples of an input/output means.

Figure 4:
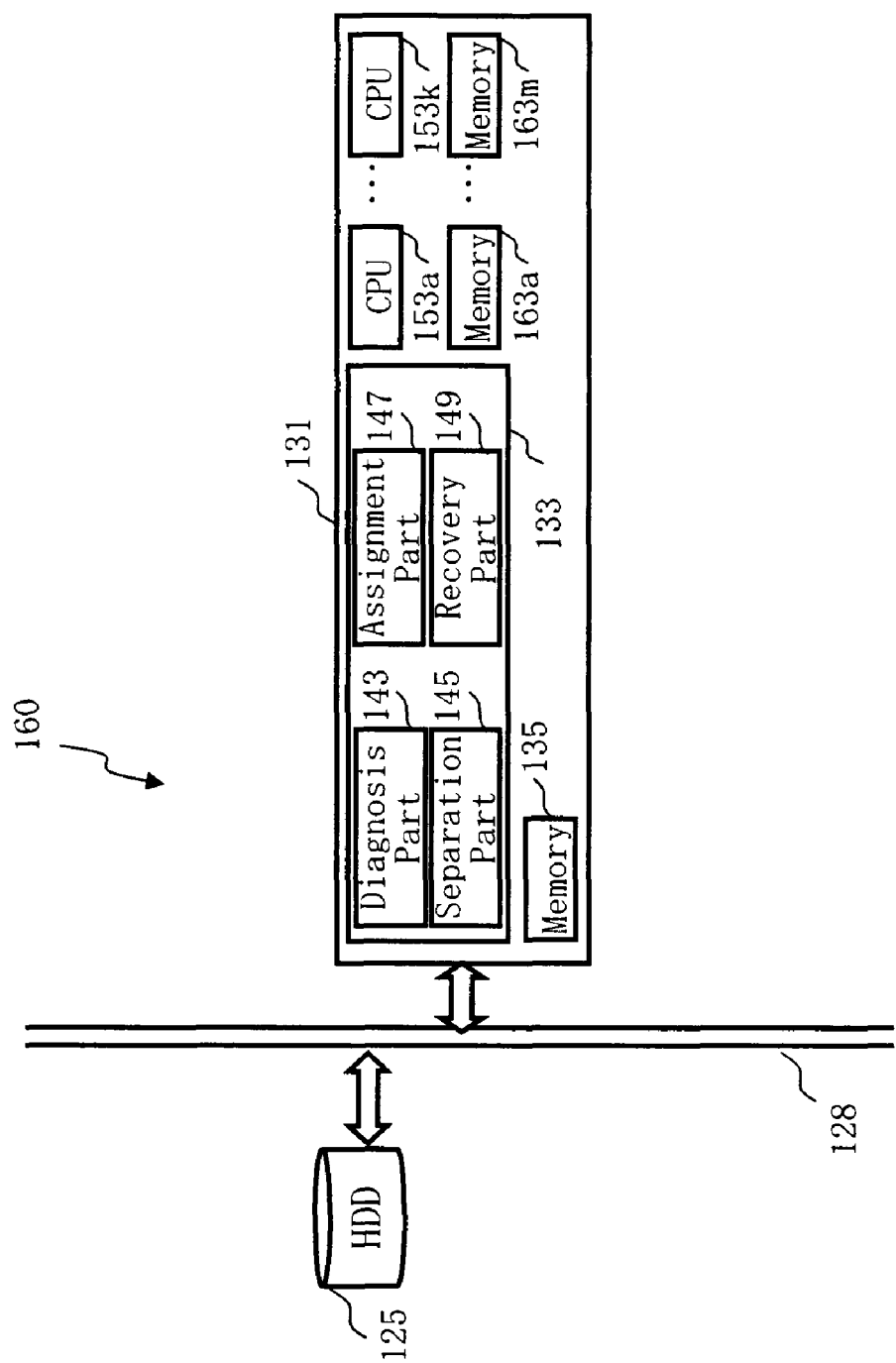
FIG. 4 is a schematic diagram showing an additional configuration of the pattern writing apparatus of FIG. 1.
Figure 5:
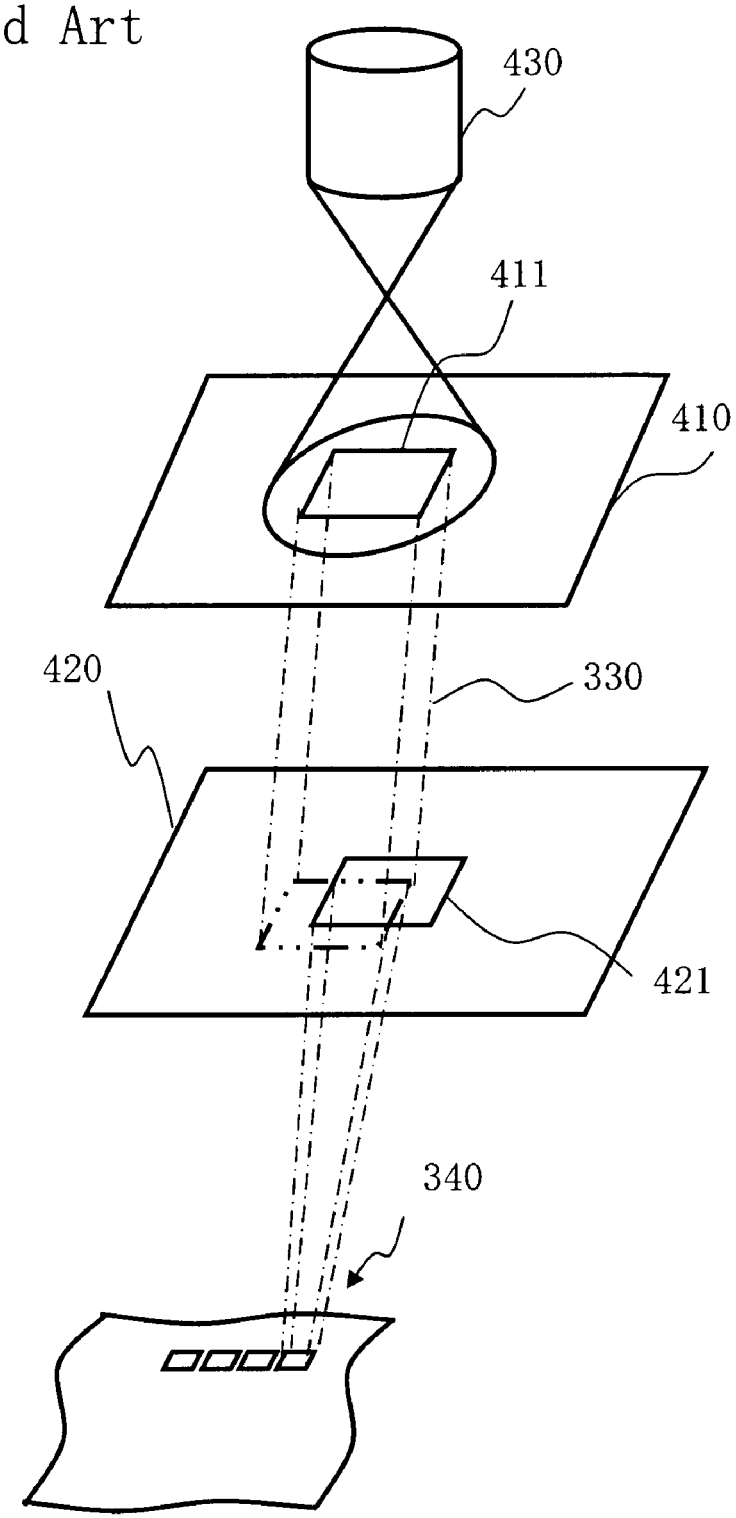
FIG. 5 shows a schematic diagram describing operations of a conventional variable-shaped electron beam writing apparatus.

The embodiment has been described with reference to concrete examples as mentioned above. However, the present invention is not limited to these concrete examples. For example, although the writing data group which has been converted/generated from the design data (layout data) is stored in the HDD 124 in the example mentioned above, it is also suitable to perform as follows:

FIG. 4 is a schematic diagram showing an additional configuration of the pattern writing apparatus of FIG. 1. In the figure, the control part 160 further includes a processing unit 131 and a hard disk drive (HDD) 125 in addition to the configuration of FIG. 1. The writing control unit 110 of FIG. 1 is connected to the processing unit 131 and the hard disk drive (HDD) 125 through the bus 128 besides being connected to the configuration of FIG. 1. In the HDD 125 serving as an example of a storage part, design data group before being converted into the writing data is stored.

Moreover, the processing unit 131 serving as an example of a processing part or a processing apparatus includes a CPU 133, a memory 135, a plurality of CPUs for performing actual data conversion processing, and a plurality of memories. In FIG. 4, the processing unit 131 includes the CPU 133, the memory 135, CPUs 153a to 153k (an example of an internal processing apparatus), and a plurality of memories 163a to 163m. Each CPU 133 serving as a computer has functions, such as a diagnosis part 143, a separation part 145, an assignment part 147, and a recovery part 149. Input data or output data processed in the CPU 133 is stored in each memory 135 in each processing unit 131. In the present case, each of the functions, such as the diagnosis part 143, the separation part 145, the assignment part 147, and the recovery part 149 is configured as software whose processing is executed by a computer (CPU 133). However, it should not be limited thereto. For example, they may be configured by hardware of an electric circuit. Alternatively, they may be executed by a combination of hardware of an electric circuit and software, or a combination of hardware and firmware. While only the configuration elements added to the configuration of FIG. 1 necessary for describing Embodiment 1 are shown in FIG. 4, it should be understood that other elements generally necessary for the pattern writing apparatus 100 may also be included.

For example, the pattern writing apparatus 100 directly inputs design data which has not been converted into writing data yet. First, the design data for each frame (drawing-region unit) is transmitted to be stored in the HDD 125. The stored design data is converted in parallel by a plurality of computers (the CPU 153a to 153k and the memories 163a to 163m). At this time, format checking processing of the design data, converting processing into writing data, and shot density calculating processing for each frame are distributed to be processed in parallel by the CPUs 153a to 153k and memories 163a to 163m. If an error occurs in a computer (CPU or a memory) during the processing and it becomes impossible to continue the processing, the computer is separated by the method mentioned above. Then, according to the method mentioned above, the processing assigned to the computer having the error is returned to be reassigned to another computer. In the case that a computer inputted design data of the subsequent frame, an error occurred at the timing of performing the processing of the input design data, and then the computer has been recovered by the method mentioned above, it is suitable to connect to the computer again to assign data processing. Moreover, it is also suitable that the diagnosis part 112 or the diagnosis part 143 firstly diagnoses the state of each computer at the time of executing the processing of design data to judge whether it is in the normal state or not. This makes it possible to improve the redundancy of the processing when performing the direct input processing mentioned above. As a result, increase of processing time caused by an unexpected computer trouble can be suppressed.

While the parts or units not directly necessary for explaining the present invention, such as the structure of the apparatus and the control methods, are not described, it is possible to suitably select and use some or all of them when needed. For example, though the description of the structure of the control unit for controlling the pattern writing apparatus 100 is omitted, it should be understood that required structures of the control unit can be appropriately selected and used.

In addition, any writing data processing control apparatus, writing method, and pattern writing apparatus that include elements of the present invention and that can be appropriately modified by those skilled in the art are included within the sprit and scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing data processing control apparatus comprising:
an assignment part configured to assign processing of a plurality of pieces of writing data of predetermined divided writing regions, stored in a storage device, one by one to one of a plurality of processing apparatuses in which processing is performed in parallel, said writing data configured to form a pattern onto a target workpiece for use in a manufacture of a semiconductor device, by using a charged particle beam; and
a separation part configured, when a processing error occurred as a result of processing of writing data read from the storage device by a first processing apparatus assigned, to separate the first processing apparatus in which the processing error occurred from assigning targets of subsequent writing data processing, wherein the assignment part reassigns the processing of the writing data in which the processing error occurred to a second processing apparatus being different from the first processing apparatus.

2. The writing data processing control apparatus according to claim 1 further comprising:
- a diagnosis part configured, when the first processing apparatus is separated from the assigning targets of the subsequent writing data processing, to output test data to the first processing apparatus and diagnose whether a processing error occurs in processing the test data; and
- a recovery part configured, when the processing error has not occurred in the processing of the test data as a diagnosing result, to recover the first processing apparatus to be added to the assigning targets of the subsequent writing data processing.

3. A writing apparatus for writing a pattern by using a lithography technique comprising:
- a storage part configured to store a plurality of pieces of writing data of predetermined divided writing regions;
- a plurality of data processing parts configured to perform processing of the plurality of pieces of writing data stored in the storage part in parallel;
- a writing data processing control part configured to assign processing of writing data in the plurality of pieces of writing data to one of the plurality of data processing parts, and reassign, when a processing error occurred in the processing of the writing data in the one of the plurality of data processing parts, the processing of the writing data to another data processing part, said writing data configured to form a pattern onto a target workpiece for use in a manufacture of a semiconductor device, by using a charged particle beam; and
- a writing part configured, based on writing data processed by one of the plurality of data processing parts, to write said pattern defined by the writing data onto said target workpiece by using said charged particle beam.

4. The writing apparatus according to claim 3, wherein the writing data processing control part further includes:
- an assignment part configured to assign processing of the plurality of pieces of writing data stored in the storage part to one of the plurality of data processing parts one by one; and
- a separation part configured, when a processing error occurred as a result of processing of writing data read from the storage device by a data processing part assigned, to separate the data processing part in which the processing error occurred from assigning targets of subsequent writing data processing,
wherein the assignment part reassigns the processing of the writing data in which the processing error occurred to another data processing apparatus.

5. The writing apparatus according to claim 4, wherein the writing data processing control part further includes:
- a diagnosis part configured, when the data processing part is separated from the assigning targets of the subsequent writing data processing, to output test data to the data processing part and diagnose whether a processing error occurs in processing the test data; and
- a recovery part configured, when the processing error has not occurred in the processing of the test data as a diagnosing result, to recover the data processing part to be added to the assigning targets of the subsequent writing data processing.

6. The writing apparatus according to claim 5, wherein
- the plurality of data processing parts respectively include a plurality of internal processing apparatuses,
- the processing of the test data is performed by one of the plurality of internal processing apparatuses, and
- the diagnosis part, when the processing error occurred in the processing of the test data outputted to the data processing part as a diagnosing result, outputs the test data to the data processing part again, makes another internal processing apparatus which is different from an internal processing apparatus previously processed the test data execute the processing of the test data again in the data processing part, and diagnoses again whether a processing error occurs in the processing of the test data.

7. The writing apparatus according to claim 6, wherein the plurality of data processing parts further includes:
- an assignment part configured to assign processing of the writing data to one of the plurality of internal processing apparatuses one by one; and
- a separation part configured, when a processing error occurred as a result of the processing of the writing data by an assigned internal processing apparatus, to separate the assigned internal processing apparatus in which the processing error occurred from the assigning targets of the subsequent writing data processing.

8. The writing apparatus according to claim 7, wherein the plurality of data processing parts further includes:
- a diagnosis part configured to diagnose whether a processing error occurs in the processing the test data; and
- a recovery part configured, when the processing error has not occurred in the processing of the test data as a diagnosing result, to recover the assigned internal processing apparatus in which the processing error occurred to be added to the assigning targets of the subsequent writing data processing.

9. A method for writing a pattern by using a lithography technique comprising:
- assigning processing of a plurality of pieces of writing data of predetermined divided writing regions, stored in a storage device, one by one to one of a plurality of processing apparatuses in which processing is performed in parallel;
- separating, when a processing error occurred as a result of processing writing data read from the storage device by a first processing apparatus assigned, to separate the first processing apparatus in which the processing error occurred from assigning targets of subsequent writing data processing, said writing data configured to form a pattern onto a target workpiece for use in a manufacture of a semiconductor device, by using a charged particle beam;
- reassigning the processing of the writing data in which the processing error occurred to a second processing apparatus being different from the first processing apparatus; and
- writing said pattern defined by the writing data onto said target workpiece by using said charged particle beam, based on the writing data processed by the second processing apparatus.

* * * * *